(12) United States Patent
Gu et al.

(10) Patent No.: US 11,289,474 B2
(45) Date of Patent: Mar. 29, 2022

(54) PASSIVE DEVICES OVER POLYCRYSTALLINE SEMICONDUCTOR FINS

(71) Applicant: GLOBALFOUNDRIES U.S. Inc., Santa Clara, CA (US)

(72) Inventors: Man Gu, Malta, NY (US); Wang Zheng, Ballston Lake, NY (US); Teng-Yin Lin, Clifton Park, NY (US); Halting Wang, Clifton Park, NY (US); Tung-Hsing Lee, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 47 days.

(21) Appl. No.: 16/853,137

(22) Filed: Apr. 20, 2020

(65) Prior Publication Data
US 2021/0327872 A1 Oct. 21, 2021

(51) Int. Cl.
| | |
|---|---|
| H01L 21/00 | (2006.01) |
| H01L 27/11 | (2006.01) |
| H01L 27/06 | (2006.01) |
| H01L 29/78 | (2006.01) |
| H01L 49/02 | (2006.01) |
| H01L 23/66 | (2006.01) |
| H01P 3/06 | (2006.01) |

(52) U.S. Cl.
CPC .......... *H01L 27/0629* (2013.01); *H01L 23/66* (2013.01); *H01L 28/10* (2013.01); *H01L 28/24* (2013.01); *H01L 29/7851* (2013.01); *H01P 3/06* (2013.01); *H01L 2223/6627* (2013.01)

(58) Field of Classification Search
CPC ..... H01L 27/0629; H01L 28/10; H01L 28/24; H01L 29/7851
USPC ........ 257/308, 343, 379; 438/157, 176, 195, 438/238, 272
See application file for complete search history.

(56) References Cited

U.S. PATENT DOCUMENTS

| | | | |
|---|---|---|---|
| 6,258,688 B1 | 7/2001 | Tsai | |
| 9,129,800 B2 | 9/2015 | Allibert et al. | |
| 9,269,591 B2 | 2/2016 | Kalnitsky et al. | |
| 10,002,868 B2* | 6/2018 | Bi | H01L 21/823431 |
| 10,032,679 B1* | 7/2018 | Guo | H01L 29/165 |
| 10,833,062 B2* | 11/2020 | Zhou | H01L 29/7851 |
| 2009/0267182 A1 | 10/2009 | Jacqueline | |
| 2016/0190120 A1* | 6/2016 | Singh | H01L 28/20 |
| 2018/0096884 A1 | 4/2018 | Shank et al. | |
| 2021/0098467 A1* | 4/2021 | Fujiwara | G11C 8/14 |

OTHER PUBLICATIONS

Raskin et al., "Trap-rich substrate enabling the RF Silicon-on-Insulator integration in all smartphones", ICTEAM Scientific Highlights 2016.

* cited by examiner

*Primary Examiner* — Calvin Lee
(74) *Attorney, Agent, or Firm* — Thompson Hine LLP; Anthony Canale

(57) ABSTRACT

Structures including a passive device and methods of forming such structures. Multiple fins are positioned on a substrate, and an interconnect structure is positioned over the substrate. The fins contain a polycrystalline semiconductor material, and the interconnect structure includes a passive device that is positioned over the fins. The passive device may be, for example, an inductor or a transmission line.

20 Claims, 6 Drawing Sheets ated circuit.

PASSIVE DEVICES OVER POLYCRYSTALLINE SEMICONDUCTOR FINS

BACKGROUND

The present invention relates to semiconductor device fabrication and integrated circuits and, more specifically, to structures including a passive device and methods of forming such structures.

Passive devices, such as transmission lines and inductors, may be formed by back-end-of-line processing in the interconnect structure of a chip. Bulk silicon substrates normally have a low electrical resistivity, which results in high electrical losses that may degrade the performance of passive devices.

Improved structures including a passive device and methods of forming such structures are needed.

SUMMARY

In an embodiment of the invention, a structure includes a substrate, a plurality of fins on the substrate, and an interconnect structure over the substrate. The plurality of fins contain a polycrystalline semiconductor material, and the interconnect structure includes a passive device that is positioned over the plurality of fins.

In an embodiment of the invention, a method includes forming a plurality of fins containing a polycrystalline semiconductor material on a substrate and forming an interconnect structure over the substrate. The interconnect structure includes a passive device that is positioned over the plurality of fins.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
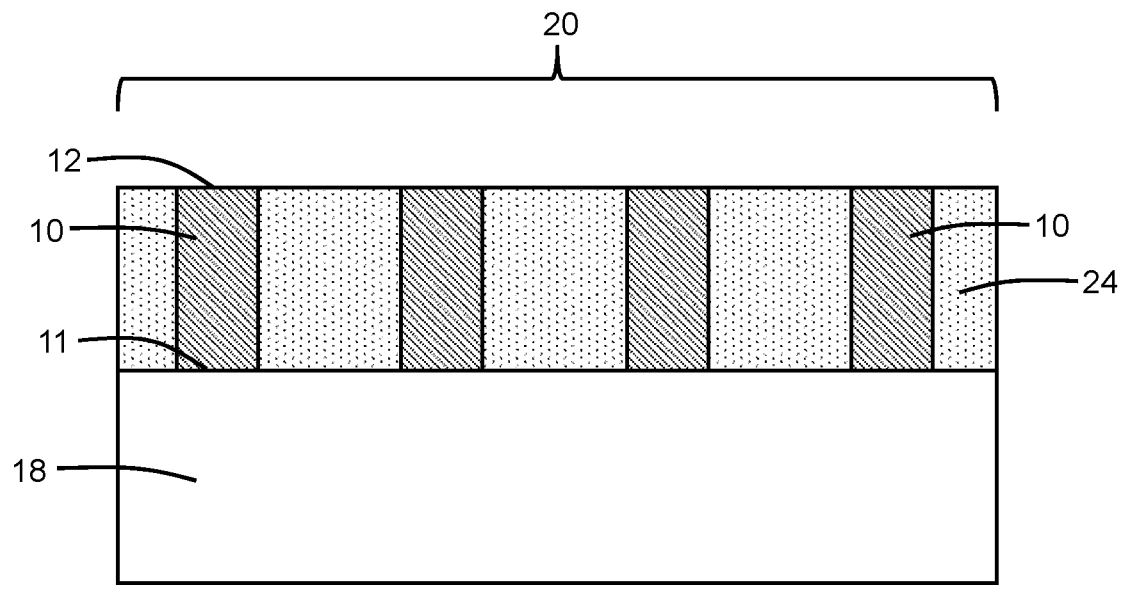
FIGS. 1, 1A are cross-sectional views of a structure at an initial fabrication stage of a processing method in accordance with embodiments of the invention.
Figure 1A:
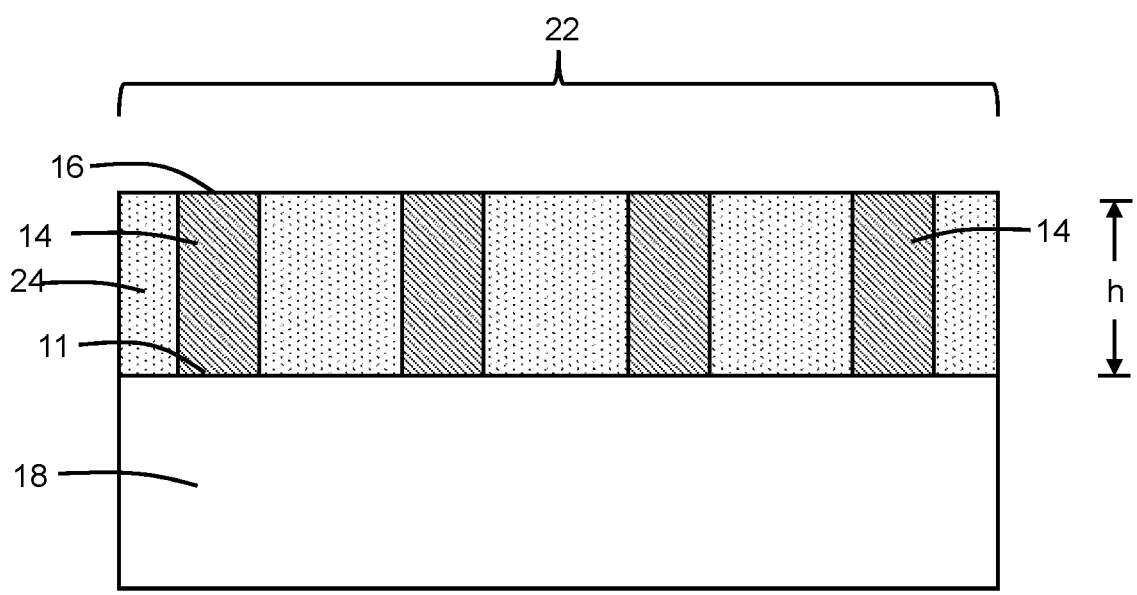

With reference to FIGS. 1, 1A and in accordance with embodiments of the invention, fins 10, 14 are formed that project from a top surface 11 of a substrate 18. The fins 10 have respective top surfaces 12 and the fins 14 have respective top surfaces 16, and the top surfaces 12, 16 may be located at a height, h, relative to the top surface 11 of the substrate 18. The substrate 18 may be composed of a single-crystal semiconductor material, such as single-crystal silicon. The substrate 18 may be, for example, a bulk wafer composed of single-crystal semiconductor material. In an embodiment, the substrate 18 may have a low electrical resistivity (e.g., an electrical resistivity less than or equal to 100 ohm-cm). The fins 10, 14 may be patterned from the substrate 18 using a multiple patterning technique, such as self-aligned double patterning (SADP) or self-aligned quadruple patterning (SAQP). In an embodiment, the fins 10, 14 may be concurrently formed by patterning the substrate 18. The fins 10 may be formed in a device region 20 of the substrate 18 and the fins 14 may be formed in a device region 22 of the substrate 18. The device region 20 may be used to form active devices of an integrated circuit, and the device region 22 may be used to form passive devices of the integrated circuit.

A dielectric layer 24 may be formed that surrounds the fins 10, 14. The dielectric layer 24 may be composed of a dielectric material, such as silicon dioxide, deposited by chemical vapor deposition or grown by thermal oxidation. Wells (not shown) may be formed by ion implanting a concentration of a dopant species and activating the dopant species by thermal annealing in the substrate 18.

Figure 2:
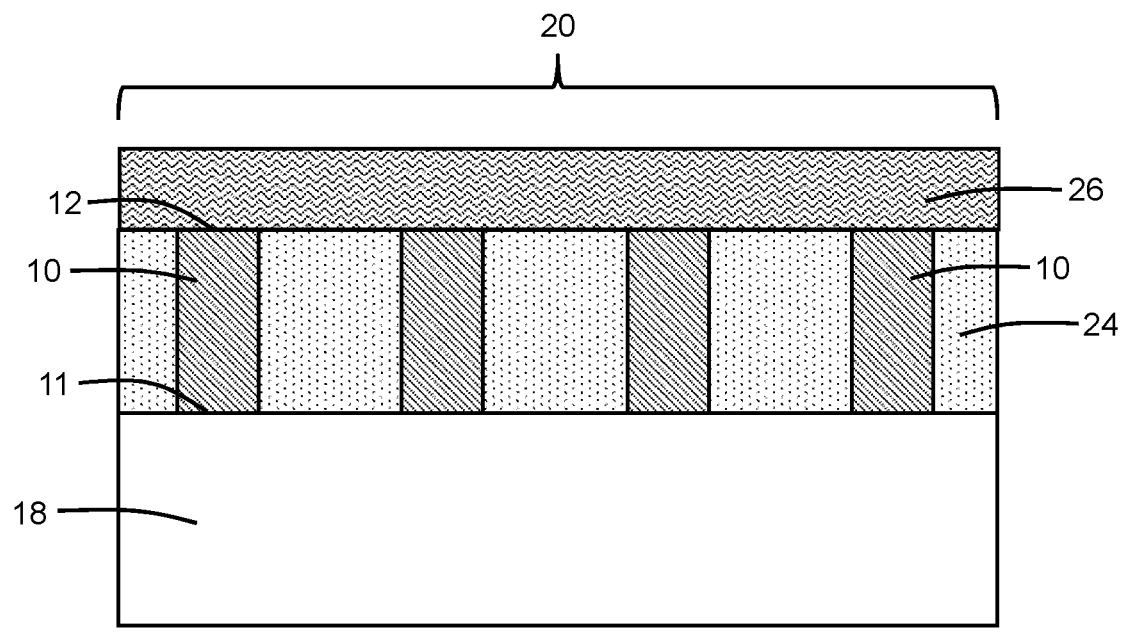
FIGS. 2, 2A are cross-sectional views of the structure at a fabrication stage of the processing method subsequent to FIGS. 1, 1A.
Figure 2A:
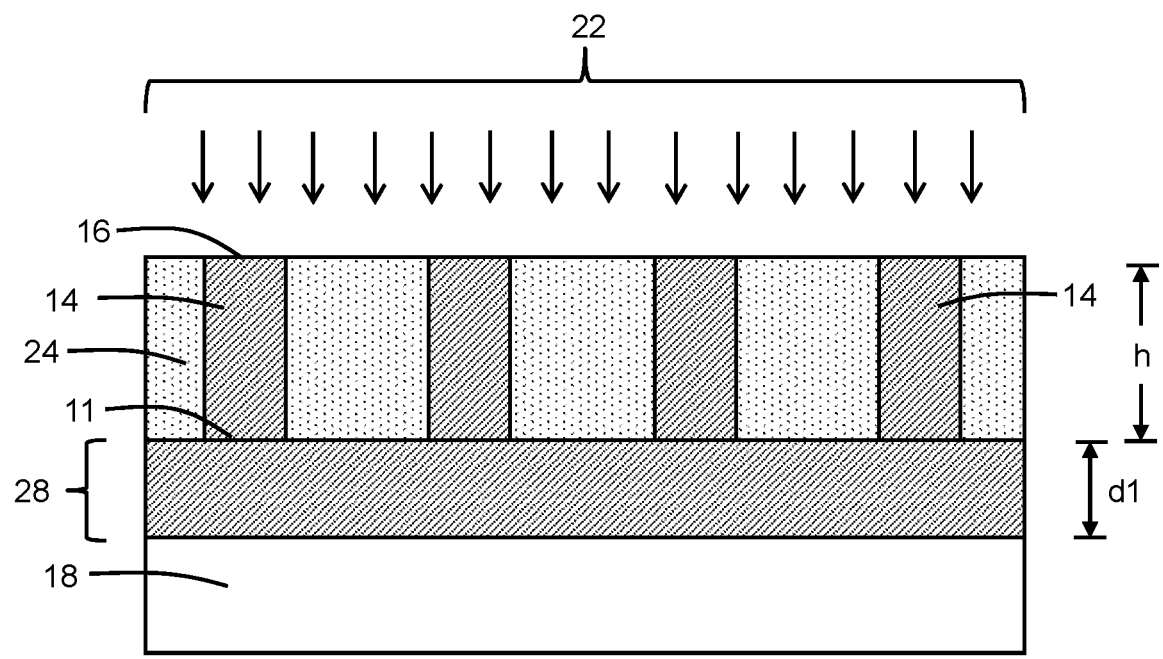

With reference to FIGS. 2, 2A in which like reference numerals refer to like features in FIGS. 1, 1A and at a subsequent fabrication stage of the processing method, an implantation mask 26 may be formed by lithography over the device region 20 of the substrate 18. The implantation mask 26 may include a layer of, for example, an organic photoresist that is applied by a spin coating process, pre-baked, exposed to light projected through a photomask, baked after exposure, and developed with a chemical developer.

After forming the implantation mask 26, the semiconductor material of the fins 14 in device region 22 and the substrate 18 beneath the fins 14 may be modified by an ion implantation process. The fins 14 and a modified region 28 of the substrate 18 may contain modified semiconductor material, such as amorphous semiconductor material. The modified region 28 may extend to a given depth, d1, below the top surface 11 of the substrate 18 that is commensurate with the range of the ions in the substrate 18. The substrate 18 may be undamaged and single crystal at depths located beyond the device region 20.

The ion implantation process damages the single-crystal semiconductor material of the fins 14 in the device region 22 and the substrate 18 over the modified region 28 beneath the fins 14. The ion implantation process introduces energetic ions, as indicated diagrammatically by the single-headed arrows, with ion trajectories that penetrate through the fins 14 and dielectric layer 24 and into the substrate 18. The energetic ions, as they penetrate through the fins 14 and substrate 18, lose energy via scattering events with atoms and electrons in the semiconductor material. Energy lost in nuclear collisions, which dominates at low kinetic energies, displaces target atoms of the fins 14 and target atoms of the substrate 18 in the modified region 28 from their original lattice sites, which damages the crystal lattice structure and generates point defects. The ions stop in the substrate 18 after the kinetic energy is fully dissipated by the energy loss.

In an embodiment, the fins 14 and modified region 28 may contain semiconductor material rendered amorphous by the ion implantation. In an embodiment, the fins 14 may contain amorphous semiconductor over their full height from their respective top surfaces 16 to their intersection with the top surface 11 of the substrate 18.

The ions may be generated from a suitable source gas and implanted into the fins 14 and substrate 18 with one or more implantation conditions using an ion implantation tool. The conditions (e.g., ion species, dose, kinetic energy) of the implantation may be selected to tune the characteristics (e.g., depth profile, amount of damage, inert gas content) of the implanted semiconductor material. The crystal lattice structure of the fins 14 and the substrate 18 in the modified region 28 may be damaged relative to its initial single-crystal state by the implanted ions. In an embodiment, the implanted ions may be generated from argon or another type of inert gas, such as xenon. In an embodiment, the ion dose may be within a range extending from $1 \times 10^{15}$ ions-cm$^{-2}$ to $3 \times 10^{15}$ ions-cm$^{-2}$ for implanted argon ions.

The implantation mask 26 has a thickness and stopping power sufficient to prevent the fins 10 and substrate 18 in the device region 20 from being implanted. As a result, the semiconductor material of the fins 10 and substrate 18 in the device region 20 is not damaged and remains single crystal. Following implantation, the implantation mask 26 may be removed by, for example, ashing.

Figure 3:
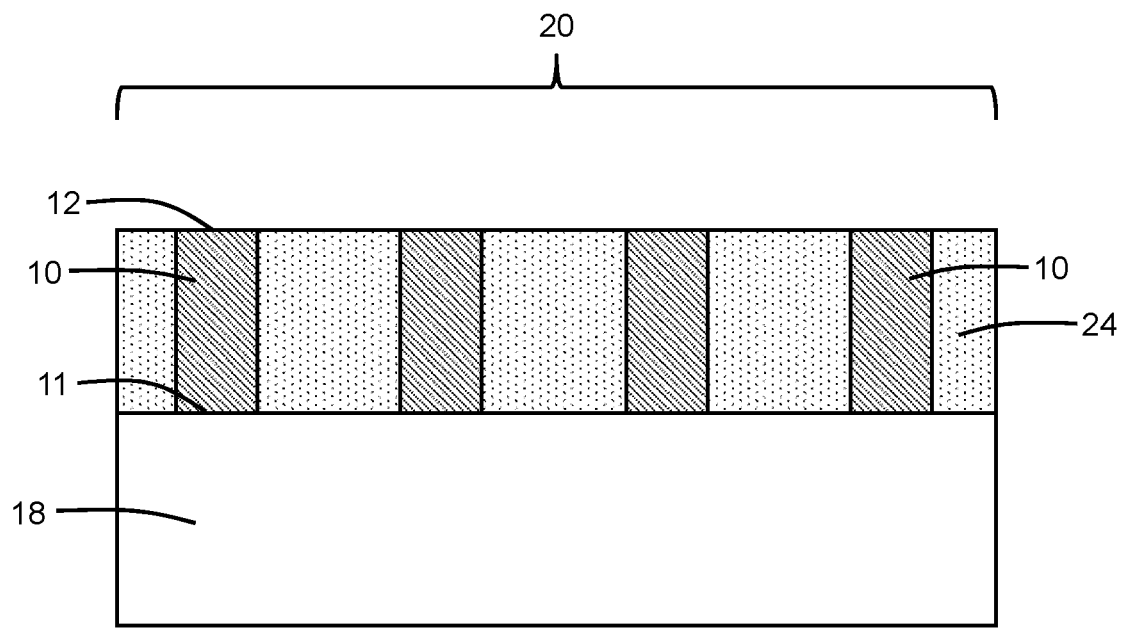
FIGS. 3, 3A are cross-sectional views of the structure at a fabrication stage of the processing method subsequent to FIGS. 2, 2A.
Figure 3A:
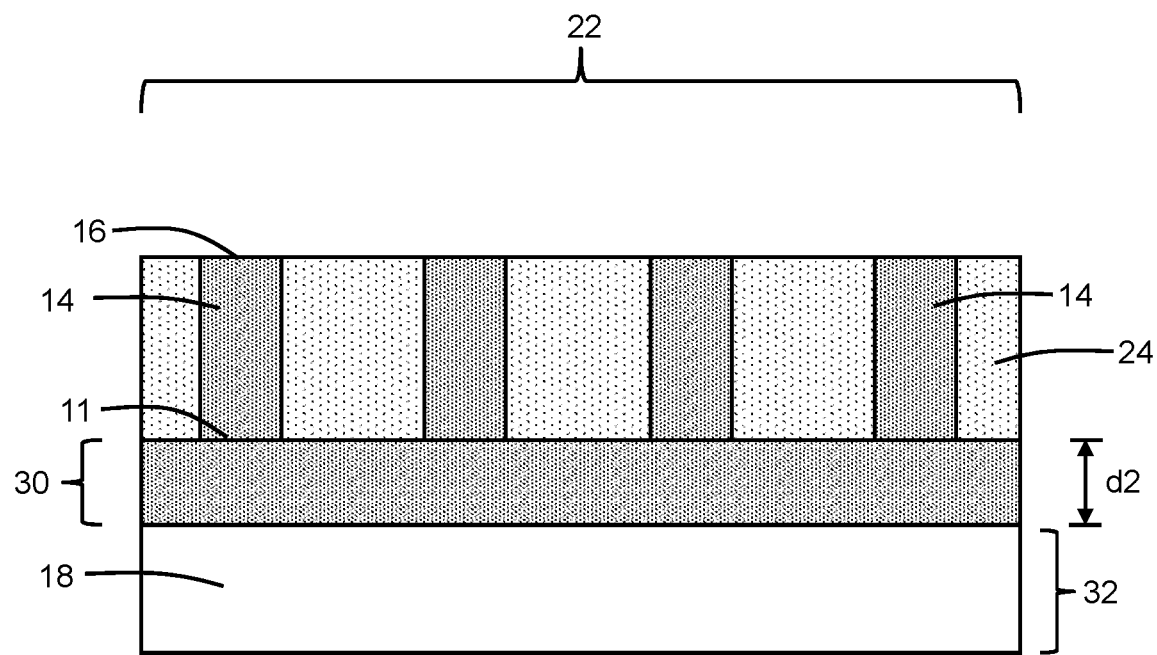

With reference to FIGS. 3, 3A in which like reference numerals refer to like features in FIGS. 2, 2A and at a subsequent fabrication stage of the processing method, the fins 14 and the substrate 18 in the modified region 28 (FIG. 2A) are thermally treated by an annealing process. In an embodiment, the annealing process may be a rapid thermal anneal (RTA) performed using, for example, a bank of flash lamps that heat the fins 10, 14 and the substrate 18 to a peak temperature in a range of 900° C. to 1125° C. and with a dwell time at the peak temperature of a few seconds.

The annealing process recrystallizes the implantation-damaged semiconductor material of the fins 14 into polycrystalline semiconductor material (e.g., polysilicon) and the implantation-damaged semiconductor material of the substrate 18 in the modified region 28 into a region 30 with in the substrate 18 also containing polycrystalline semiconductor material. The polycrystalline semiconductor material may also contain defects as residual damage in addition to the grains of the polycrystalline semiconductor material. The defects may contain atoms of the inert gas species (e.g., argon) that were ion implanted. The single-crystal semiconductor material of the substrate 18, which is arranged below the modified region 28, provides a crystalline template for recrystallization. In an embodiment, the region 30 may have slightly smaller dimensions than the modified region 28. The single-crystal semiconductor material contained in the fins 10 and substrate 18 in the device region 20 may be unaffected or substantially unaffected by the annealing process due to the absence of crystalline damage and retains the original electrical resistivity.

The polycrystalline semiconductor material of the fins 14 and the region 30 of the substrate 18 may be characterized as a trap-rich material that is capable of efficiently capturing charge carriers. The region 30 extends to a given depth, d2, into the substrate 18, and a region 32 of the substrate 18 is arranged beneath the region 30 at depths greater than the depth, d2, is single-crystal semiconductor material. The polycrystalline semiconductor material of the fins 14 and the region 30 of the substrate 18 have an electrical resistivity that is greater than the electrical resistivity of the single-crystal semiconductor material in the region 32 of the substrate 18. In an embodiment, the polycrystalline semiconductor material of the fins 14 and the region 30 of the substrate 18 may have an electrical resistivity greater than or equal to 1,000 ohm-cm. In an embodiment, the polycrystalline semiconductor material of the fins 14 and the region 30 of the substrate 18 may have an electrical resistivity that is in a range of about 1,000 ohm-cm to about 10,000 ohm-cm.

Figure 4:
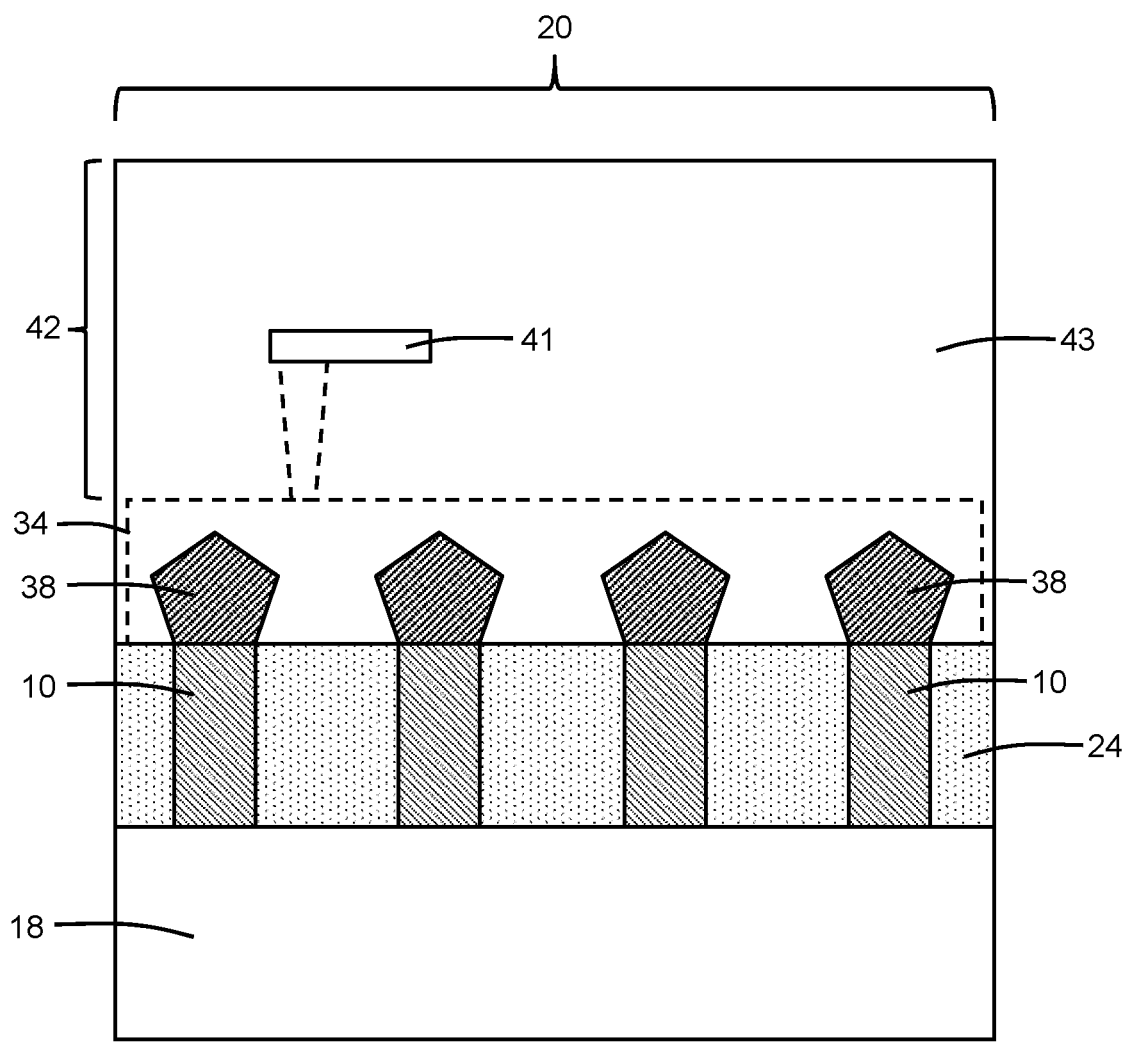
FIGS. 4, 4A are cross-sectional views of the structure at a fabrication stage of the processing method subsequent to FIGS. 3, 3A.
Figure 4A:
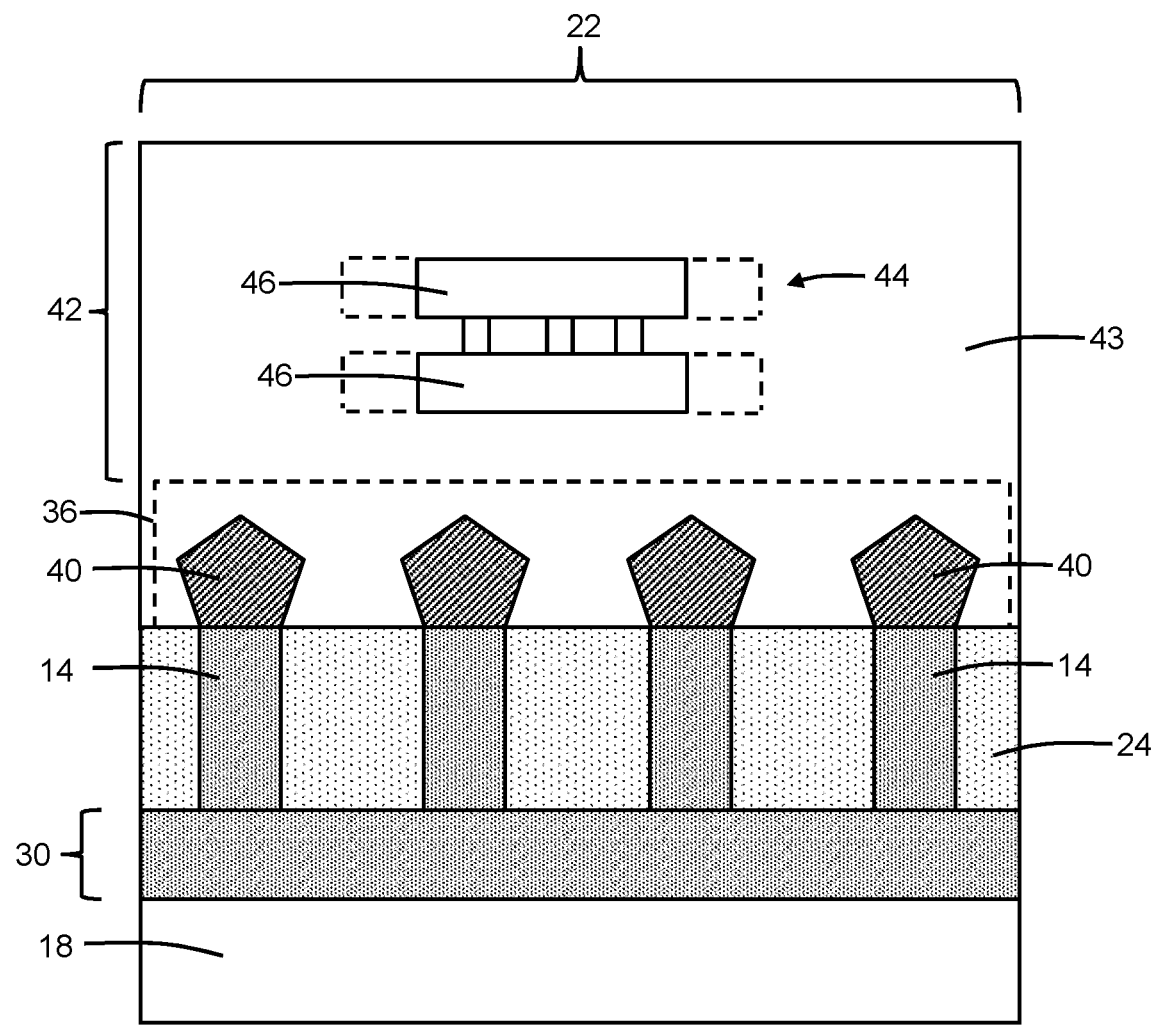

With reference to FIGS. 4, 4A in which like reference numerals refer to like features in FIGS. 3, 3A and at a subsequent fabrication stage of the processing method, a gate structure 34 of a field-effect transistor is formed that extends transversely across the fins 10, and a gate structure 36 is formed that extends transversely across the fins 14. The gate structure 34 has an overlapping relationship with the fins 10, and the gate structure 36 has an overlapping relationship with the fins 14. The gate structures 34, 36 may include a gate electrode and a gate dielectric formed by depositing a layer stack and patterning the layer stack with photolithography and etching. The gate electrode may be composed of a conductor, such as doped polycrystalline silicon (i.e., polysilicon) or a work function metal, and the gate dielectric may be composed of an electrical insulator, such as silicon dioxide or hafnium oxide.

A layer 38 containing a semiconductor material is epitaxially grown in respective sections from the surfaces of the fins 10, and a layer 40 containing a semiconductor material is epitaxially grown in respective sections from the surfaces of the fins 14. The epitaxial growth process may be selective in that the semiconductor material does not grow from dielectric surfaces, such as the surfaces of the dielectric layer 24. The sections of the semiconductor layer 38, which epitaxially grow from the single-crystal fins 10, may contain single-crystal semiconductor material. The sections of the semiconductor layer 40, which epitaxially grow from the polycrystalline fins 14, may contain polycrystalline semiconductor material.

The semiconductor layers 38, 40 may be in situ doped during epitaxial growth with a concentration of a dopant. In an embodiment, the semiconductor layers 38, 40 may be in situ doped during epitaxial growth with an n-type dopant, such as phosphorus and/or arsenic, that provides n-type conductivity. In an alternative embodiment, the semiconductor layers 38, 40 may be in situ doped during epitaxial growth with a p-type dopant, such as boron, that provides p-type conductivity. The semiconductor layers 38, 40 may have a composition that contains germanium and silicon and, in an embodiment, the semiconductor layers 38, 40 may be composed of silicon-germanium. In an embodiment, the semiconductor layers 38, 40 may be composed of silicon-germanium and may contain a p-type dopant (e.g., boron). In an alternative embodiment, the semiconductor layers 38, 40 may be composed of silicon and may contain an n-type dopant (e.g., phosphorus).

Middle-of-line (MOL) processing and back-end-of-line (BEOL) processing follow, which includes formation of metal features 41, such as contacts, vias, and wiring, for an interconnect structure 42 that is coupled with the field-effect transistor in the device region 20. The interconnect structure 42 may be formed by depositing interlayer dielectric layers 43 composed of dielectric material and forming the metal features 41 in the various interlayer dielectric layers 43 to define metallization levels. In an embodiment, the gate structure 36 overlapping the fins 14 may not be contacted by the interconnect structure 42 because the overlapped fins 14 are dummy fins that are not incorporated into active devices.

An inductor 44 is provided as a passive device that is formed within the back-end-of-line portion of the interconnect structure 42 in the device region 22. The inductor 44 may include interconnected spirals 46 that are arranged in the interconnect structure 42 over the fins 14 and gate structure 36. The spirals 46 of the inductor 44 are composed of one or more back-end-of-line metals and are arranged in the interlayer dielectric layers 43 in different metallization levels of the interconnect structure 42. The inductor 44 has a quality factor given by a ratio of its inductive reactance to its resistance at a given frequency and is a measure of its efficiency. Increasing the quality factor of the inductor 44 improves its performance. Higher quality factors reflect a reduction in dissipated energy relative to stored energy.

The fins 14 and the region 30 are formed with altered crystallinity without modifying either the fins 10 or the portion of the substrate 18 beneath the fins 10, which are used to form active devices in device region 20. The fins 14 and the region 30 may improve the performance of the inductor 44 by acting as an isolation layer between the inductor 44 and the portion of substrate 18 beneath the region 30. The fins 14 and region 30 may locally increase the electrical resistivity of the substrate 18 beneath the inductor 44. The isolation may function to reduce electrical loss and thereby improve the quality factor of the inductor 44. The elevated substrate resistivity may be embodied in, for example, a radiofrequency integrated circuit that includes passive devices like the inductor 44.

Figure 5:
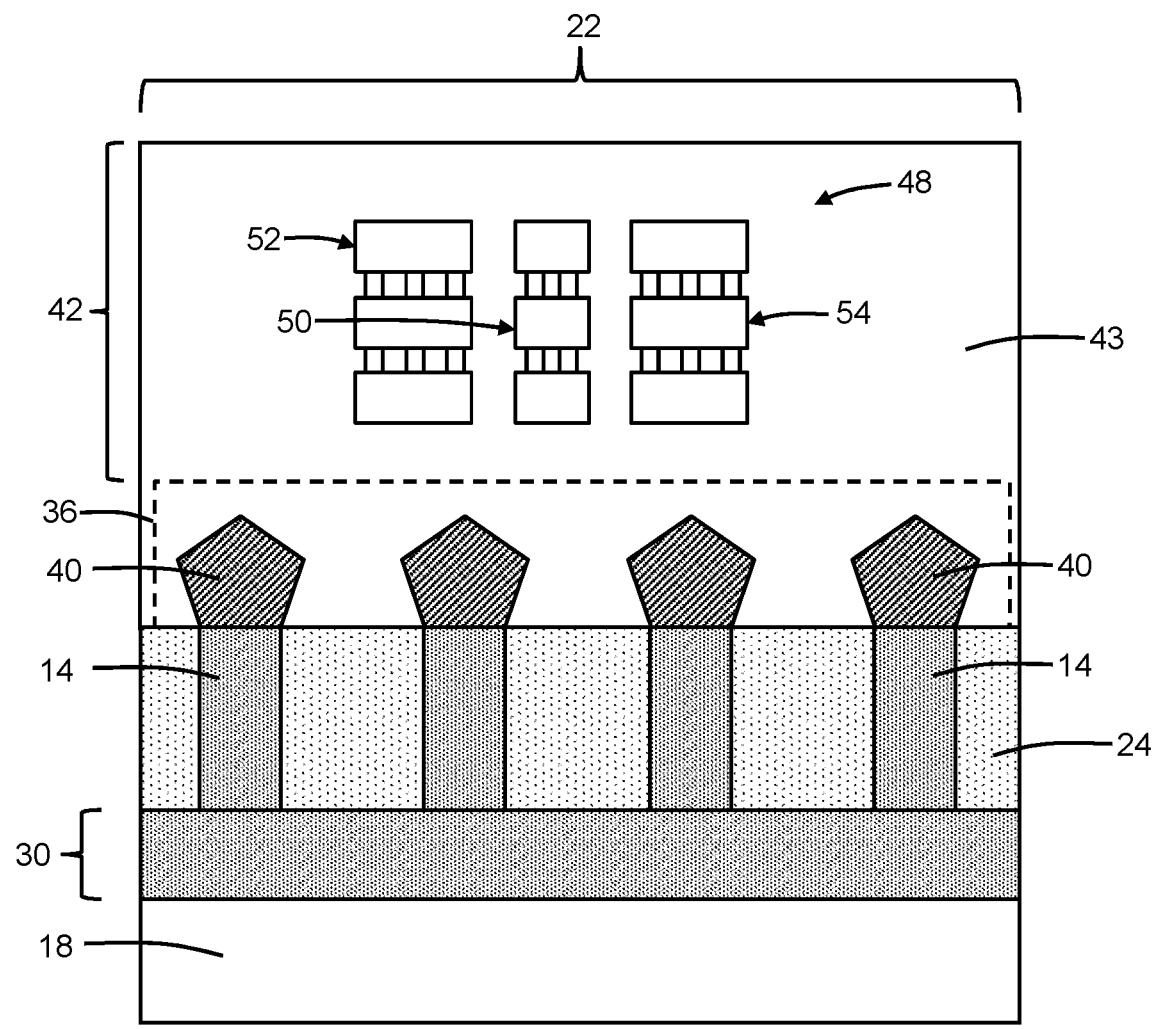
FIG. 5 is a cross-sectional view of a structure in accordance with alternative embodiments of the invention.

With reference to FIG. 5 in which like reference numerals refer to like features in FIG. 4A and in accordance with alternative embodiments, the passive device may be a transmission line 48 having a central signal line 50 that is flanked by shield lines 52, 54. The signal line 50 and shield lines 52, 54 of the transmission line 48 are composed of one or more back-end-of-line metals and are disposed in the interlayer dielectric layers 43 of different metallization levels of the interconnect structure 42. The transmission line 48 also has a quality factor that is improved by the altered crystallinity of the fins 14 and the region 30.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming a first plurality of fins comprised of a first polycrystalline semiconductor material on a substrate, wherein the substrate includes a top surface and a region beneath the top surface, the region is comprised of a second polycrystalline semiconductor material, the first plurality of fins have a height relative to the top surface of the substrate, the first plurality of fins contain the first polycrystalline semiconductor material over an entirety of the height, and the first plurality of fins are positioned over the region;
forming a gate structure having an overlapping relationship with the first plurality of fins; and
forming an interconnect structure over the substrate, wherein the interconnect structure includes a passive device that is positioned over the first plurality of fins, and the gate structure is not contacted by the interconnect structure.

2. The method of claim 1 wherein the second polycrystalline semiconductor material of the region is concurrently formed with the first polycrystalline semiconductor material of the first plurality of fins.

3. The method of claim 1 wherein the first polycrystalline semiconductor material of the first plurality of fins has an electrical resistivity that is in a range of 1,000 ohm-cm to 10,000 ohm-cm.

4. The method of claim 1 wherein forming the first plurality of fins comprised of the first polycrystalline semiconductor material on the substrate comprises:
implanting the first plurality of fins with ions of an inert gas species to cause crystalline damage; and
annealing the first plurality of fins to repair the crystalline damage and form the first polycrystalline semiconductor material.

5. The method of claim 4 wherein the first plurality of fins are located in a first device region, a second plurality of fins are located in a second device region, and further comprising:
masking the second plurality of fins with an implantation mask when the first plurality of fins are implanted.

6. The method of claim 1 further comprising:
epitaxially growing a section of a semiconductor layer on each of the first plurality of fins.

7. The method of claim 6 wherein the semiconductor layer comprises a third polycrystalline semiconductor material.

8. A structure comprising:
a substrate including a top surface and a first region beneath the top surface, the first region comprised of a first polycrystalline semiconductor material;
a plurality of fins on the substrate, the plurality of fins comprised of a second polycrystalline semiconductor material, the plurality of fins having a height relative to the top surface of the substrate, the plurality of fins containing the second polycrystalline semiconductor material over an entirety of the height, and the plurality of fins positioned over the first region;
an interconnect structure over the substrate, the interconnect structure including a passive device that is positioned over the plurality of fins; and
a gate structure having an overlapping relationship with the plurality of fins,
wherein the gate structure is not contacted by the interconnect structure.

9. The structure of claim 8 wherein the second polycrystalline semiconductor material of the plurality of fins and the first polycrystalline semiconductor material of the first region each have an electrical resistivity that is in a range of about 1,000 ohm-cm to about 10,000 ohm-cm.

10. The structure of claim 8 wherein the second polycrystalline semiconductor material of the plurality of fins and the first polycrystalline semiconductor material of the first region each have an electrical resistivity that is greater than or equal to 1,000 ohm-cm.

11. The structure of claim 8 wherein the substrate includes a second region comprised of a single-crystal semiconductor material, and the first region is positioned between the second region and the plurality of fins.

12. The structure of claim 8 wherein the second polycrystalline semiconductor material of the plurality of fins has an electrical resistivity that is in a range of about 1,000 ohm-cm to about 10,000 ohm-cm.

13. The structure of claim 8 wherein the second polycrystalline semiconductor material of the plurality of fins has an electrical resistivity that is greater than or equal to 1,000 ohm-cm.

14. The structure of claim 8 wherein the second polycrystalline semiconductor material is polysilicon.

15. The structure of claim 8 wherein the passive device is a transmission line.

16. The structure of claim 8 wherein the passive device is an inductor.

17. The structure of claim 11 wherein the single-crystal semiconductor material of the second region has an electrical resistivity that is less than or equal to 100 ohm-cm.

18. The structure of claim 17 wherein the second polycrystalline semiconductor material of the plurality of fins and the first polycrystalline semiconductor material of the first region each have an electrical resistivity that is in a range of about 1,000 ohm-cm to about 10,000 ohm-cm.

19. The structure of claim 8 further comprising:
a semiconductor layer including a section on each of the plurality of fins.

20. The structure of claim 19 wherein the semiconductor layer comprises a third polycrystalline semiconductor material.

* * * * *